(12) United States Patent
Schindler et al.

(10) Patent No.: US 9,647,327 B2
(45) Date of Patent: May 9, 2017

(54) MULTILAYERED FILM ELEMENT

(75) Inventors: Ulrich Schindler, Furth/Bayern (DE);
Christian Schumacher, Furth (DE);
Stefan Mieslinger, Essenbach (DE)

(73) Assignee: LEONHARD KURZ STIFTUNG & CO. KG, Furth (DE)

( * ) Notice: Subject to any disclaimer, the term of this patent is extended or adjusted under 35 U.S.C. 154(b) by 464 days.

(21) Appl. No.: 13/805,416

(22) PCT Filed: Jun. 11, 2011

(86) PCT No.: PCT/EP2011/002878
§ 371 (c)(1),
(2), (4) Date: Mar. 6, 2013

(87) PCT Pub. No.: WO2011/160782
PCT Pub. Date: Dec. 29, 2011

(65) Prior Publication Data
US 2013/0154885 A1 Jun. 20, 2013

(30) Foreign Application Priority Data
Jun. 21, 2010 (DE) .......................... 10 2010 024 523

(51) Int. Cl.
*H01Q 1/36* (2006.01)
*H01Q 1/38* (2006.01)
(Continued)

(52) U.S. Cl.
CPC ............. *H01Q 1/38* (2013.01); *G06K 19/077* (2013.01); *G06K 19/07722* (2013.01);
(Continued)

(58) Field of Classification Search
CPC ...... H01Q 13/20; H01L 24/50; G06K 19/027; G06K 19/07749; G06K 19/07758; C08K 3/34
See application file for complete search history.

(56) References Cited

U.S. PATENT DOCUMENTS 3,987,455 A * 10/1976 Olyphant, Jr. ................ 343/829
4,756,080 A *  7/1988 Thorp et al. .................... 29/827
(Continued)

FOREIGN PATENT DOCUMENTS

DE           19647845       5/1998
DE         102004059281    4/2006
(Continued)

*Primary Examiner* — Dieu H Duong
*Assistant Examiner* — Noel Maldonado
(74) *Attorney, Agent, or Firm* — Hoffmann & Baron, LLP

(57) ABSTRACT

The invention relates to a multilayered film element (1) comprising a first component, more particularly an RFID antenna in the form of a multilayered film element, and to a method for fixing a second component on a film element (1) of this type. The film element (1) has a dielectric layer (10) having a front side (10V) and a rear side (10R). The film element (1) has a layer (11, 12) forming a first component, and at least one component contact area (23, 24) arranged on the front side (10V) and connected to the first component. The film element (1) has at least one thermode contact layer (30) which is arranged on the dielectric layer (10) and which, as seen perpendicularly to the dielectric layer (10), is arranged in the region of the at least one component contact area (23, 24). The thermode contact layer (30) has a thermode contact area (32) on a side facing away from the dielectric layer (10), said thermode contact area forming an outer surface of the film element (1).

26 Claims, 11 Drawing Sheets

(51) Int. Cl.
   *G06K 19/077*   (2006.01)
   *H01L 23/498*   (2006.01)
   *H01Q 1/22*     (2006.01)
   *H01Q 7/00*     (2006.01)
   *H05K 3/30*     (2006.01)
   *H05K 1/16*     (2006.01)
   *H05K 3/38*     (2006.01)

(52) U.S. Cl.
   CPC .. *G06K 19/07779* (2013.01); *H01L 23/49855* (2013.01); *H01Q 1/2225* (2013.01); *H01Q 7/00* (2013.01); *H05K 3/305* (2013.01); *H01L 2924/0002* (2013.01); *H05K 1/165* (2013.01); *H05K 3/38* (2013.01); *H05K 2201/09781* (2013.01); *H05K 2201/10098* (2013.01); *Y02P 70/613* (2015.11)

(56) References Cited

U.S. PATENT DOCUMENTS

| | | | |
|---|---|---|---|
| 5,213,248 A * | 5/1993 | Horton et al. | 228/44.7 |
| 6,020,629 A * | 2/2000 | Farnworth | H01L 24/06 174/255 |
| 6,214,460 B1 * | 4/2001 | Bluem et al. | 428/355 AC |
| 6,884,833 B2 * | 4/2005 | Chheang et al. | 524/445 |
| 2003/0100654 A1 * | 5/2003 | Chheang et al. | 524/445 |
| 2006/0220877 A1 * | 10/2006 | Ferguson et al. | 340/572.7 |
| 2009/0140827 A1 * | 6/2009 | Yoshikawa | 333/176 |
| 2010/0147958 A1 * | 6/2010 | Martinent et al. | 235/492 |
| 2010/0308968 A1 * | 12/2010 | Tamm et al. | 340/10.1 |

FOREIGN PATENT DOCUMENTS

| | | |
|---|---|---|
| DE | 102007004642 | 8/2008 |
| DE | 102007058802 | 6/2009 |

\* cited by examiner

MULTILAYERED FILM ELEMENT

This application claims priority based on an International Application filed under the Patent Cooperation Treaty, PCT/EP2011/002878, filed on Jun. 11, 2011, and German Application No. DE 10201002.4523.2-53, filed on Jun. 21, 2010.

BACKGROUND OF THE INVENTION

The invention relates to a multilayered film element comprising a first component, more particularly an RFID antenna in the form of a multilayered film element, and to a method for fixing a second component on such a multilayered film element (RFID=Radio Frequency Identification).

An RFID transponder comprises at least one antenna and an electronic microchip, called "chip" for short, which are arranged on a carrier. In one known method for producing an RFID transponder, firstly an antenna substrate, i.e. a multilayered film element comprising a carrier substrate and at least one electrically conductive layer as RFID antenna, is provided and then the antenna is electrically connected to a transponder chip. One widely used way of mounting the chip on the antenna substrate is flip-chip bonding. In this case, the chip is provided with contact bumps on its active contact-making side ("chip bond pads"), turned over—hence the name flip-chip—, aligned and arranged with its contact-making side on corresponding chip contact areas ("substrate bond pads") of the antenna substrate such that an electrically conductive contact is produced between the chip and the antenna. In an alternative embodiment, the chip can be mechanically fixed and electrically contact-connected on a wiring element, for example a so-called "strap", wherein the wiring element for its part has contact elements which are arranged on corresponding chip contact areas ("substrate bond pads") of the antenna substrate, such that an electrically conductive contact is produced between the chip and the antenna.

A heating device, e.g. a heatable pressure plunger (thermode), can be brought into contact with one or more components in order that the antenna and the chip or the antenna and the wiring element with the chip mounted thereon are permanently mechanically connected to one another. In this case, suitable adhesives or solders can be employed as "connecting means". By way of example, adhesive applied previously in the region of the chip contact areas can be activated, e.g. cured, after the positioning of the flip-chip or of the wiring element with the chip mounted thereon on the antenna substrate, by means of a thermode. In this way, mechanical fixing and electrical contact-making are effected during flip-chip mounting or the mounting of the wiring element with the chip mounted thereon in a single process step. Moreover the electrical contact locations are protected against environmental influences by virtue of being embedded in the adhesive. Flip-chip mounting is described in DE 10 2004 059 281 B3 and DE 10 2007 058 802 B3.

During connecting processes in which components are connected to multilayered film elements of this type, e.g. during the chip bonding of transponder chips or wiring elements with a chip mounted thereon on multilayered film elements of this type, more particularly on RFID antennas in the form of multilayered film elements, it has been found, then, that when using substrates composed of readily meltable materials, e.g. PVC-ABS, as a carrier for the RFID antenna, adhering deposits of these materials on a thermode can occur (PVC=polyvinyl chloride; ABS=acrylonitrile-butadiene-styrene copolymer). However, adhering deposits of material on the thermode prevent a uniform and whole-area contact between the thermode and the substrate, which leads to production faults.

US 2010/147958 A1 relates to a method for producing a device comprising a transponder antenna which is connected to contact areas. A thermode is used in this case. In one embodiment, an antenna cable is brought into contact with the dielectric layer. The rear side of the dielectric layer can then be contacted with a thermode. The antenna cable is fixed in interaction with the thermode by a plunger.

DE 10 2007 004642 A1 relates to a flexible printed circuit board film comprising two copper plies. In one embodiment, a first copper ply with electrical contacts is situated on the top side. Situated on the rear side is a second copper ply, thereon an adhesive layer and thereon a polyimide layer, which functions as a thermode contact layer with the surface.

DE 196 47 845 A1 discloses a method for producing a smartcard. A semiconductor chip situated on a module is mechanically and electrically contact-connected in a cutout of a cable carrier. Said cutout has connection areas which are part of or lead to an inductive information transmission device arranged in the smartcard. The semiconductor chip can be situated on a carrier substrate having at its underside contact sides which lead to the connection areas of the inductive information transmission device. For cohesively connecting said contacts to the connection areas, the module is inserted with the carrier substrate rear side first into the cutout of the card body and soldered by means of thermodes, for instance.

SUMMARY OF THE INVENTION

The invention is based on the object, then, of specifying an improved multilayered film element and an improved method in and respectively by which disturbing adhering deposits of material on a thermode are prevented.

This object is achieved by a multilayered film element comprising a dielectric layer having a front side and a rear side situated opposite the front side, wherein the film element has a layer forming a first component, and at least one component contact area arranged on the front side and connected to the first component and serving for arranging a second component, wherein the film element has at least one thermode contact layer which is arranged on the dielectric layer and which, as seen perpendicularly to the dielectric layer, is arranged in the region of the at least one component contact area and has a thermode contact area on a side of the at least one thermode contact layer facing away from the dielectric layer, said thermode contact area forming an outer surface of the film element. The layer forming the first component is a metal layer having a thickness of 1 μm to 50 μm, preferably of 5 μm to 15 μm. The thermode contact layer is likewise embodied as a metal layer.

This object is furthermore achieved by a method for fixing a second component on a multilayered film element as claimed in any of claims 1 to 21, wherein the method comprises the following steps: coating a side of the second component which has contact areas and/or the at least one component contact area with a thermally activatable connecting means, preferably a thermally activatable, in particular conductive, adhesive; arranging the side of the second component which has the contact areas on the at least one component contact area; contacting the at least one thermode contact area with a thermode for activating the connecting means; and separating the thermode from the at least one thermode contact area after the connecting means has been activated. The method according to the invention constitutes a connecting process, also called bonding process, for connecting a second component to a multilayered film element.

It is preferred for the first component or the second component or both to be embodied as electrical or electronic components. Examples of such electrical or electronic components are antenna structures, conductor track structures, electronic microchips, called "chip" for short, batteries, more particularly flexible film batteries for supplying energy or buffering energy for a chip or for further components, signal output devices such as e.g. loudspeakers, piezoelectric elements, display elements, e.g. light-emitting diodes, liquid crystal displays or further signal processing or signal conditioning components which process, in particular, electrical signals received by an antenna structure.

In the following description, the term "chip" should be understood such that it encompasses both a chip as such and a wiring element or contact-making element with a chip mounted thereon. Examples of such a wiring element or contact-making element with a chip mounted thereon are a so-called "chip-on-strap" or a so-called "adaptive kernel", in which the wiring element or contact-making element can also have an antenna besides the chip. In this case, "mounted" should be understood as, in particular, mechanically fixing and/or electrically conductive and/or thermally conductive connection.

"Thermally activatable" can mean that the connecting means is completely or partly cured by the action of heat, that is to say that a thermally curable connecting means is involved. "Thermally activatable" can also mean that, besides the action of heat, in addition an energy input into the connecting means or some other type of external influence on the connecting means for initiating chemical reactions in the connecting means is effected, in particular by means of electric and/or magnetic fields or by means of visible or non-visible light, UV radiation, IR radiation or by means of the action of moisture (UV=ultraviolet; IR=infrared). It is also possible for the thermally activatable connecting means to be a dual-curing connecting means, i.e. curable by one of the following combinations: photoinitiated+heat or heat+moisture.

The dielectric layer can consist of a single layer or have a plurality of layer plies, at least one ply of which has dielectric properties. This one or this plurality of layers can be embodied as a film or a film laminate. The dielectric layer forms a substrate on which further layers are applied, including at least one, preferably electrically conductive, layer. In this way, at least one first component, e.g. an antenna structure, and at least one component contact area, e.g. a chip contact area, are formed on the dielectric layer. The dielectric layer has two sides: a first side of the dielectric layer forms the front side or frontal side with the at least one component contact area on which a second component, preferably a chip, is arranged directly or indirectly by means of a wiring element; the other, opposite side of the dielectric layer forms the rear side or underside. On the front side and/or the rear side of the dielectric layer, besides the first component and the second component, even further, in particular electrical or electronic, components can be arranged which preferably form a functional unit together with the first component and the second component or form electrical functional units separate therefrom.

The terms "front side", "frontal side", "rear side" and "underside" relate to an arbitrary definition in which that side of the dielectric layer on which at least one component contact area is arranged and on which, consequently, a second component is also arranged is designated as the "front side" or "frontal side" and the opposite side of the dielectric layer is designated as the "rear side" or "underside". However, this definition is not associated with any restrictions with regard to the actual orientation of the dielectric layer in a production method or during a subsequent use of the film element. Alternatively, the term "first side" or "component side" could likewise be used instead of "front side" and the term "second side" could be used instead of "rear side".

In the case of the indication "as seen perpendicularly to the dielectric layer", the dielectric layer is regarded as a layer of approximately constant thickness and having two plane-parallel boundary surfaces, in particular front side and rear side. A view of a component perpendicularly to the dielectric layer corresponds in this approximation to a projection of the component onto the front side or the rear side of the dielectric layer, the projection being effected perpendicularly to the plane-parallel boundary surfaces.

The at least one thermode contact layer is a planar element embodied in a spatial fashion, comprising an inner end side which faces the dielectric layer and via which it is connected to the dielectric layer, an outer end side which faces away from the dielectric layer and which forms the thermode contact area, and one or more side surfaces connecting the two end sides and preferably running substantially perpendicularly to the dielectric layer.

The at least one thermode contact layer can be arranged, relative to the dielectric layer, in the same plane as the layer forming the first component, or in a plane which, relative to the dielectric layer, lies above or below the plane of the layer forming the first component.

The invention proposes equipping the film element with the at least one thermode contact layer comprising the thermode contact area, wherein the at least one thermode contact layer, as seen perpendicularly to the dielectric layer of the film element, is arranged in the region of the at least one component contact area. In this case, the thermode contact area forms the outer surface of the film element, that is to say that it is situated at the surface of the multilayered film element, and is therefore directly contactable by a thermode brought up to the film element externally, that is to say that the thermode can be arranged temporarily on the thermode contact area and can then be separated again from the thermode contact area. The thermode contact area is brought into direct contact with the thermode in order to activate a thermally activatable connecting means situated between the at least one component contact area and the second component. Heat is transmitted from the thermode via the thermode contact layer to the connecting means, where it leads to an activation of the connecting means.

If the dielectric layer contains readily meltable material, the heat of the thermode can lead to melting of said material (=substrate material). Since, according to the invention, the thermode is not directly in contact with the dielectric layer, but rather bears against the thermally stable thermode contact area, this avoids the situation in which, when separating the thermode from the thermode contact area, melted substrate material adheres to the thermode and thus possibly results in destruction of, preferably electrical, components arranged on the dielectric layer, in particular of electrically conductive structures such as antenna structures, or the like. In this way, the production of film elements on which a component, e.g. a chip, is fixed by means of thermodes is considerably improved by the present invention.

The thermode contact layer also leads to a homogenization of the temperature distribution in the substrate during a connecting process for connecting the second component to the multilayered film element, e.g. during a chip bonding process. Locally increased temperatures, i.e. undesirable temperature spikes, in the substrate are avoided as a result of the homogenization of the temperature distribution. Therefore, in the case of the method according to the invention, the thermode can even have a higher maximum temperature than in conventional connecting processes, e.g. conventional chip bonding processes (e.g. a temperature increase by +30° C. is possible), without undesirable melting of the carrier substrate occurring. The higher temperature of the thermode leads to higher temperatures in the region of the component contact area, with the result that the activation duration of a thermally activatable connecting means, e.g. the curing duration of a thermally curable conductive adhesive, is significantly reduced. A higher machine throughput and a reduction of the process costs are possible as a result. Moreover, as a result of the higher temperature in the region of the component contact areas, possibly a restriction to special adhesives that cure at relatively low temperatures is obviated, such that more cost-effective adhesives and materials that require higher temperatures for their activation can also be used.

By comparison with an alternative method for avoiding disturbing adhering deposits of material, wherein a silicone paper is carried along between lower thermode and dielectric layer, the present invention has the advantage that there is no need to make a costly modification to the production installation which allows the silicone paper to be carried along. Carrying along silicone paper or the like between a thermode and the dielectric layer in a costly manner and in a manner susceptible to disturbances is rendered superfluous by the invention. It should be mentioned in this connection that, in the case of the chip bonding machines available at the present time, the dictates of design mean that it would be possible only with high outlay to carry along a silicone paper or the like between the antenna substrate and a lower thermode in order to prevent such adhering deposits.

Advantageous developments of the invention are designated in the dependent claims.

It is possible for the layer forming the first component to be a metal layer composed of, for example, fair copy iron, copper, aluminum, nickel, silver, gold, platinum, tin, zinc or an alloy of these metals and/or multilayer systems. It is possible for the layer forming the first component to form an antenna structure, that is to say for the first component to be an antenna structure. It is possible for the at least one component contact area to be electrically connected to the first component.

It is possible for the multilayered film element to comprise a dielectric layer having a front side and a rear side situated opposite the front side, wherein the multilayered film element has an electrically conductive layer forming an antenna structure, and at least one chip contact area which is arranged on the front side and is electrically connected to the antenna structure, wherein the film element has at least one thermode contact layer which is arranged on the dielectric layer and which, as seen perpendicularly to the dielectric layer, is arranged in the region of the at least one chip contact area and has a thermode contact area on a side of the at least one thermode contact layer facing away from the dielectric layer, said thermode contact area forming an outer surface of the film element. In this case, it is preferred for the multilayered film element to form an RFID antenna.

The second component is arranged on the multilayered film element by virtue of the contact areas of the second component being arranged on the at least one component contact area. It is possible for the contact areas of the second component to be embodied as thermal contacts via which a thermal connection between the second component and the first component is produced. It is likewise possible for the contact areas of the second component to be embodied as electrical contacts, e.g. metalized regions, via which an electrical connection between the second component and the first component is produced.

It is possible for the method to be a method for fixing a chip on a multilayered film element as claimed in any of claims 1 to 21, wherein, in the method, a side of the chip and/or of the at least one chip contact area which has electrical contacts is coated with a thermally activatable connecting means, preferably a thermally activatable adhesive, the side of the chip which has the electrical contacts is arranged on the at least one chip contact area, the at least one thermode contact area is contacted with a thermode in order to activate the connecting means, and the thermode is separated from the at least one thermode contact area after the connecting means has been activated.

It is possible for the at least one thermode contact layer to be arranged only on the front side of the dielectric layer, that is to say to be embodied as a front-side thermode contact layer which is arranged on the front side and which encloses the at least one component contact area at least in regions. In this case, it is preferred for the at least one thermode contact layer, as seen perpendicularly to the dielectric layer, to be at a distance from the at least one component contact area. The embodiment of the front-side thermode contact layer is advantageous particularly when a device for the connecting process described, e.g. a chip bonding installation, has an upper thermode that comes into contact with the front side of the dielectric layer. In this way, it is possible to prevent substrate material from adhering to the upper thermode.

The use of the terms "upper thermode" and "lower thermode" is an arbitrary definition in which a thermode assigned to the front side of the dielectric layer is designated as the "upper thermode", and a thermode assigned to the rear side of the dielectric layer is designated as the "lower thermode". However, this definition is not associated with any restrictions with regard to the actual orientation of a thermode in a production method.

It is also possible for the at least one thermode contact layer to be arranged only on the rear side of the dielectric layer, that is to say to be embodied as a rear-side thermode contact layer which is arranged on the rear side and which overlaps and/or encloses the at least one component contact area, as seen perpendicularly to the dielectric layer, at least in regions. This embodiment is advantageous particularly when a device for the connecting process described, e.g. a chip bonding installation, has a lower thermode which comes into contact with the rear side of the dielectric layer. In this way, it is possible to prevent substrate material from adhering to the lower thermode.

It is likewise possible for the at least one thermode contact layer to be arranged both on the front side and on the rear side of the dielectric layer, that is to say to be embodied as at least one front-side thermode contact layer which is arranged on the front side and which encloses the at least one component contact area at least in regions, and as at least one rear-side thermode contact layer which is arranged on the rear side and which overlaps and/or encloses the at least one component contact area, as seen perpendicularly to the dielectric layer, at least in regions. This embodiment is advantageous particularly when a device for the connecting process described, e.g. a chip bonding installation, has an upper thermode which comes into contact with the front side of the dielectric layer, and has a lower thermode which comes into contact with the rear side of the dielectric layer. The embodiment of at least one front-side thermode contact area and of at least one rear-side thermode contact area makes it possible to prevent substrate material from adhering to the upper thermode and the lower thermode.

Furthermore, with the embodiment of the thermode contact area on both sides, the temperature distribution and also the heat conduction during the bonding process can be positively influenced, process times can be reduced and overall costs can be minimized. Therefore, the embodiment of a thermode contact layer both on the front side and on the rear side of the dielectric layer can also be advantageous when only the lower thermode is placed onto the rear side of the dielectric layer, but the upper thermode or an unheated pressure plunger acting as a counterbearing, or a preferably plane-parallel plate is placed onto the side (=top side) of the second component, e.g. of a chip, which faces away from the film element, i.e. even if there would be a lower risk of substrate material adhering to the upper thermode or the pressure plunger.

It has proved to be worthwhile if the front-side thermode contact layer overlaps the rear-side thermode contact layer at least in regions. The temperature distribution and also the heat conduction during the bonding process can be positively influenced by this means, too.

In preferred embodiments, the at least two thermode contact layers arranged on the front side and the rear side are shaped from different materials and/or else with different layer thicknesses. This can be advantageous when temperature gradients over the component cross section are desired.

It has proved to be worthwhile if the rear-side thermode contact layer completely covers the at least one component contact area, as seen perpendicularly to the dielectric layer, that is to say has the same size and the same form, or completely projects beyond said at least one component contact area. In this way, substantially uniform heating of the component contact area is achieved, that is to say a homogenization of the temperature distribution in the region of the component contact area, particularly if the thermode contact layer is formed from a material having good thermal conductivity and/or the thermode contact layer bears against the thermode substantially with its entire thermode contact area. The more the rear-side thermode contact layer, as seen perpendicularly to the dielectric layer, laterally projects beyond the at least one component contact areas, the more uniformly it is possible to regulate the temperature of the component contact area.

It is also possible for the at least one front-side thermode contact layer and the at least one rear-side thermode contact layer to be thermally coupled to one another by a heat-conducting component. It has proved to be worthwhile if said heat-conducting element is formed from a relatively flexible material in order that the thermode pressure of the thermode(s) forming a load on the front-side and/or rear-side thermode contact layer(s) does not become non-uniform as a result of the heat-conducting element. It has proved to be worthwhile if said heat-conducting element has a thermal conductivity in the range of greater than 10 W/(m K). In this case, metals having good thermal conductivity and resin systems filled with e.g. nanotubes and/or nanoparticles have proved to be suitable materials.

In accordance with one preferred exemplary embodiment of the invention, the at least one thermode contact layer is formed from a thermally conductive material having a thermal conductivity in the range of greater than 50 W/(m K), in particular from one or more of the metals copper (Cu), aluminum (Al), silver (Ag), gold (Au), platinum (Pt), nickel (Ni), tin (Sn), zinc (Zn) and/or alloys and/or layer systems of these metals. It has proved to be worthwhile for the at least one thermode contact layer to be embodied as a metal layer, which can also consist of a metal alloy or a metal multilayer.

It is possible for the at least one thermode contact layer to be embodied in the form of a metallization. In this case, the metallization may have been provided by a method in which, in a metallization layer arranged on a substrate, a patterned seed layer in the form of the at least one thermode contact area is produced by a mask exposure and subsequent removal (e.g. etching-away) of the exposed or unexposed regions. It is also possible for the patterned seed layer to be generated by means of a printing method using a conductive printing ink. In both cases, the patterned seed layer can be reinforced by an electrolytic material deposition until the thermode contact layer has a desired layer thickness.

The thermode contact area can also be produced using one or more of the following methods or processes: electrolytic processes, patterning, LDS (=Laser Direct Structuring), ablation, adhesive bonding, lamination, embossing, printing, vapor deposition (also via a mask), spraying.

It is also possible for the at least one thermode contact layer to comprise nanotubes, in particular carbon nanotubes, and/or nanoparticles, in particular carbon nanoparticles, and/or mixtures thereof.

It is preferred for the at least one thermode contact layer to be formed from a thermally stable material that is stable in a temperature range of 25 to 300° C., in particular of 25 to 200° C.

It has additionally proved to be worthwhile if the at least one thermode contact area has a circular or rectangular contour. It is preferred for the at least one thermode contact area to be embodied as a circular area, having a diameter in the range of 5 to 20 mm. It is further preferred for the at least thermode contact area to be embodied as a square, having a side length in the range of 5 to 20 mm. Preferably, the at least one thermode contact area has a maximum extent in the range of 2 to 50 mm, in particular of 5 to 25 mm. It is further preferred for the at least one thermode contact area to be adapted in terms of size and form to a thermode assigned to it, e.g. to have a size and/or form very similar to or the same as the contact area of the thermode.

It is possible for the at least one thermode contact area, as measured in the plane of the dielectric layer, to have a maximum extent in the range of 2 to 50 mm, in particular of 5 to 25 mm.

It is possible for the at least one thermode contact layer to have a maximum layer thickness in the range of 2 to 50 μm, in particular of 6 to 14 μm. It is also possible for the at least one thermode contact layer, as measured perpendicularly to the dielectric layer, to have a non-uniform layer thickness. In this case, provision can also be made for forming layer thickness gradients within the at least one thermode contact layer, in order thus to influence the thermal conductivity in a targeted manner.

It is possible for the at least one thermode contact layer, as seen perpendicularly to the dielectric layer, to comprise two or more partial regions (=individual regions) insulated from one another. In this case, at least two of the partial regions can consist of different materials and/or be embodied differently in terms of size and/or form.

In the case of a rear-side thermode contact layer, it is preferred for said thermode contact layer to have a circular inner region without cutouts and a ring-shaped outer region with cutouts, said outer region being adjacent to the inner region. In this case, cutouts, proceeding from the inner region, can run radially outward and/or arcuately around the inner region. It is preferred for the circular inner region to have an external diameter in the range of 1 to 5 mm, and for the ring-shaped outer region to have an external diameter in the range of 5 to 20 mm.

In the case of a front-side thermode contact layer, it is preferred for said thermode contact layer to be embodied as at least two circular area segments which are not connected to one another, run around the bonding process region, e.g. the chip bond region, and are at a distance therefrom. In this case, it is further preferred to choose a radial distance between said segments in the range of 100 µm to 5 mm, in particular of 150 to 500 µm. With further preference, the at least two thermode contact area segments have a maximum extent in the range of 2 to 50 mm, in particular of 5 to 25 mm.

It has additionally proven to be worthwhile if the layer forming the first component has a first layer arranged on the front side, a second layer arranged on the rear side, and one or more plated-through holes which penetrate through the dielectric layer and by means of which the first layer and the second layer are electrically or thermally conductively connected to one another, wherein the at least one thermode contact layer and the one or more plated-through holes, as seen perpendicularly to the dielectric layer, are arranged without mutual overlap. "Without mutual overlap" means that the one or more plated-through holes either directly adjoin the thermode contact layer or are spaced apart therefrom. Preferably, the at least one thermode contact layer and the one or more plated-through holes, as seen perpendicularly to the dielectric layer, have a distance of at least 200 µm.

It is possible for the first component to have a two-sided construction comprising a first layer (=first part of the first component) arranged on the front side of the dielectric layer and a second layer (=second part of the first component) arranged on the rear side of the dielectric layer. It is possible to arrange on the front side of the dielectric layer a first electrically conductive layer, e.g. a first conductor track segment such as an antenna segment, and on the rear side of the dielectric layer a second electrically conductive layer, e.g. a second conductor track segment such as an antenna segment, or else only a connecting segment for two ends of the front-side conductor track segment. Preferably, the first and second conductor track segments are shaped in coil-type fashion in the form of one or more turns. In the case of the two-sided construction of the first component, the one or more plated-through holes between the front side and the rear side of the dielectric layer electrically connect the first layer, e.g. the first conductor track segment, and the second layer, e.g. the second conductor track segment, to one another.

A plated-through hole comprises a respective contact location at the front side and the rear side and also a connecting element which runs through the dielectric layer and which electrically connects the two contact locations. It is preferred for the at least one thermode contact layer, as seen perpendicularly to the dielectric layer, to project beyond neither the contact locations nor the connecting elements of the one or more plated-through holes. By positioning the plated-through holes outside the region of the thermode contact layer and thus outside the region of the thermode, a non-uniform thermode pressure is avoided. It should be mentioned in this connection that this also prevents additional pressure forces from being exerted on the plated-through holes and possibly destroying the latter.

Furthermore, it is possible for the at least one thermode contact area, as seen perpendicularly to the dielectric layer, to have one or more cutouts, e.g. holes, stamped-out portions, perforations, penetrating completely through the at least one thermode contact layer. In this case, it is possible for the one or more cutouts and/or the thermode contact area surrounding the cutouts to provide an optical information item, e.g. an alphanumeric character, a symbol, a graphic, a pattern. Examples of such patterns are, for example, concentrically extending annuli, radial segments, wave structures, parallel strips, checkered structures, etc., or combinations thereof. In this way, a security element, a decorative element or an identification can be provided by the at least one thermode contact layer. It is also possible for the at least one thermode contact layer to be at least partly colored and/or to have an inherent coloration, which can likewise be utilized as a security feature or for enhancing contrast for optical recognition systems or as decoration. It is possible for firstly a whole-area thermode contact layer to be produced and for the cutouts to be formed subsequently in the whole-area thermode contact layer, e.g. by laser ablation. It is also possible for the cutouts to be present in all production stages of the thermode contact layer. It is preferred for the area ratio of the one or more cutouts to the thermode contact area to be in the range of 5:1 to 1:5.

Cutouts in the thermode contact area can make it possible for a layer arranged above the thermode contact area and a layer arranged below the thermode contact area to adhere to one another through the cutouts, thus improving a mechanical connection of the two layers, the so-called interlayer adhesion, in the region of the thermode contact layer. The interlayer adhesion between a layer, e.g. a cover layer, arranged above the thermode contact area and a layer, e.g. a dielectric layer, arranged below the thermode contact area is of importance in particular in the case of a card lamination, that is to say in the case where a layer covering the thermode contact layer is applied to the antenna substrate.

In accordance with one preferred exemplary embodiment of the invention, the at least one thermode contact area has a surface relief, e.g. a rastering, a line raster, a diffraction structure. It is possible, in order to form the surface relief, for an embossing die to be pressed into the still deformable at least one thermode contact layer, thus forming at least one thermode contact area with a surface relief. In this case, it is possible for the surface relief to bring about an optical effect, e.g. a diffraction effect. In this way, a security element or a decorative element can be provided by the at least one thermode contact layer.

It is possible for the at least one thermode contact layer to be electrically conductively connected to the layer forming the first component and/or to the at least one component contact area, or to be electrically insulated from the layer forming the first component and/or from the at least one component contact area.

In this case, provision can be made for the at least one thermode contact layer to be electrically conductively connected to the first component, e.g. one or more conductor track segments such as an antenna, and/or the at least one component contact area before the bonding process, e.g. the chip bonding process, but to be arranged separately therefrom, i.e. in a manner electrically insulated therefrom, after the bonding process.

In this context, provision can be made for the method according to the invention furthermore to comprise the following step: severing an electrically conductive connection between the at least one thermode contact layer and the layer forming the first component, and/or the at least one component contact area. This can be achieved e.g. by thermal or else mechanical severing of preferably thin contact bridges during the bonding process. For this purpose, the thermode can have cutting contacts or a contact bridge can be melted or destroyed thermally in some other way by the thermal energy of the thermode. The use of a laser for severing the contact bridge is also possible.

An electrical insulation during the production process can also be advantageous in the following way: during the production of the film element, the thermode contact layer is electrically conductively connected to a first component, e.g. one or more conductor track segments, and/or one or more component contact areas and/or one or more electrical contact locations of the multilayered film element, in order in this case to achieve improved production of homogeneous layer thicknesses by electroplating, that is to say by means of an electrolytic layer construction, in particular in order to improve an electrolytic method for the electrolytic layer reinforcement of electrically conductive structures of the film element. After the bonding process, by contrast, an electrically insulated thermode contact layer can be advantageous, e.g. in order to avoid electromagnetic interference effects as a result of the conductive area of the thermode contact layer in conjunction with a component, in particular an antenna. Furthermore, it is also possible for a fine adaptation of the frequency to be effected by means of the capacitance in a subsequent process, e.g. by means of a laser ablation, at the thermode contact layer.

It is also possible for the at least one thermode contact layer to form a part of an electrical component of the film element. In this case, provision can also be made for the at least one thermode contact layer to be a part of the electrical component before the bonding process, but said part is decoupled after the bonding process and thereby becomes electrically inactive, e.g. by separation with respect to the rest of the conductor track. It has furthermore proved to be worthwhile for the at least one thermode contact layer to form a part of an electrical component of the film element. It is thus possible in this context for the at least one thermode contact layer to constitute a part of a capacitor area, of a resistor or the like, as a result of which the function and performance of the component can be influenced. It is also conceivable for the thermode contact layer itself to be embodied in the form of a coil or coil element having a predefined inductance, which can be connected in series or else in parallel with the rest of the component.

It is also possible for the at least one thermode contact layer to be formed from a material that is anisotropic with regard to thermal conductivity. In this case, it is possible for the heat conduction within the thermode contact layer preferably to take place in one direction. This can be realized, on the one hand, for example such that the thermode contact layer is formed from parallel structures constructed from thermally conductive material. In the case of a heat input on an outer side of the thermode contact layer, faster heat conduction preferably occurs in the direction of said parallel structures, whereas reduced heat conduction occurs in a perpendicular direction relative thereto. On the other hand, however, the heat conduction can also be influenced in a targeted manner by means of varying the layer thickness of the thermally conductive material.

It is also possible for the thermode contact layer to be partly or completely removed again from the dielectric layer after the bonding process in one or more succeeding process steps.

BRIEF DESCRIPTION OF THE DRAWINGS

The invention is explained by way of example below on the basis of a plurality of exemplary embodiments with reference to the following drawings. The drawings, in order to simplify the illustration, are merely schematic and not true to scale. In the figures.

DETAILED DESCRIPTION OF THE INVENTION

Figure 1:
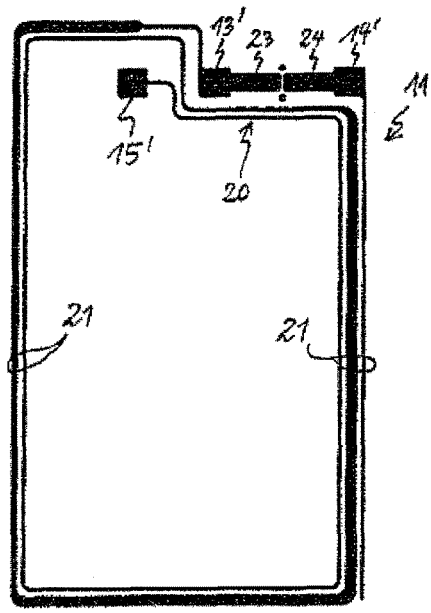
FIG. 1 shows a first electrically conductive layer arranged on a front side of a dielectric layer.

FIG. 1 shows a first layer forming a first component, said first layer being arranged on a front side of a dielectric layer and being embodied as a first electrically conductive layer 11. The first electrically conductive layer 11 forms two chip contact areas 23 and 24, wherein the first chip contact area 23 is connected to a front-side contact-making area 13' for a first plated-through hole 13 and via a coil-shaped or spiral conductor track segment 21 of a conductor track 20 to a front-side contact-making area 15' for a third plated-through hole 15. The second chip contact area 24 is connected to a linear remainder of the coil-shaped or spiral conductor track segment 21 by means of a front-side contact-making area 14' for a second plated-through hole 14.

Figure 2:
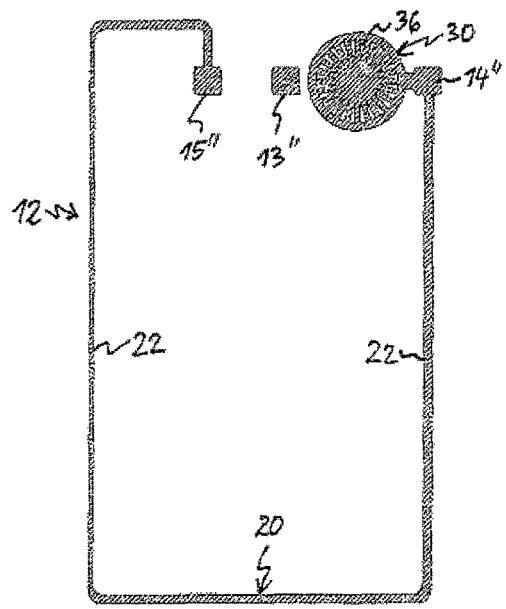
FIG. 2 shows a second electrically conductive layer and a thermode contact layer, which are arranged together on a rear side of a dielectric layer.

FIG. 2 shows a second layer forming the first component, said second layer being embodied as a second electrically conductive layer 12, and a thermode contact layer 30, which are arranged together on a rear side of the dielectric layer. The second electrically conductive layer 12 has an arcuate conductor track segment 22 of the conductor track 20, said conductor track segment connecting a rear-side contact-making area 15" for the third plated-through hole 15 to a rear-side contact-making area 14" for the second plated-through hole 14. Furthermore, the second electrically conductive layer 12 comprises a rear-side contact-making area 13" for the first plated-through hole 13 and also an electrical connecting element, which connects the rear-side contact-making area 14" to the thermode contact layer 30.

Figure 2A:
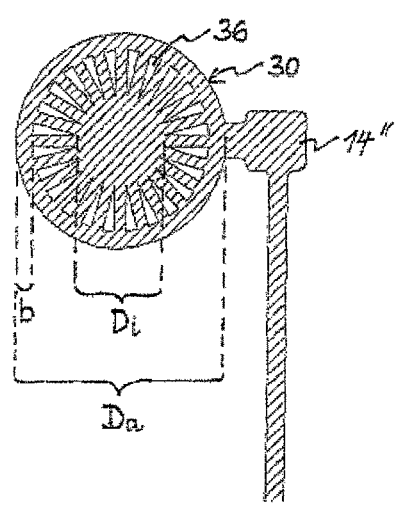
FIG. 2A shows an enlarged view of the rear-side thermode contact layer according to FIG. 2.

As illustrated in an enlarged manner in FIG. 2A, the thermode contact layer 30 has differently embodied partial regions and has the form of a spoked wheel having a thickness d, consisting of an inner disk ("hub") having a diameter Di, an outer ring ("rim") having an external diameter Da, a wall thickness b and a height d, and also a ring-shaped region ("ring of spokes") which connects the inner disk and the outer ring and which has k (in this exemplary embodiment k=24) radially extending, rectangular elements each having a length of ½(Da−Di−2b), a width of πDi/k and a height d.

Alternatively, the thermode contact layer 30 can be described as a circular disk having a thickness d and an external diameter Da which has, in a hollow-cylindrical region having an internal diameter Di and an external diameter Da−2b, a total of k (in this exemplary embodiment, k=24) wedge-shaped cutouts 36 uniformly arranged radially, wherein the pointed edges of the wedges are oriented toward the disk axis and run parallel to the disk axis. Column 2 of the table indicates typical values and particularly advantageous values (identified by "preferably" in the table) of the layer thickness d, of the external diameter Da, of the internal diameter Di and of the width b for the present exemplary embodiment of the thermode contact layer 30.

Figure 3:
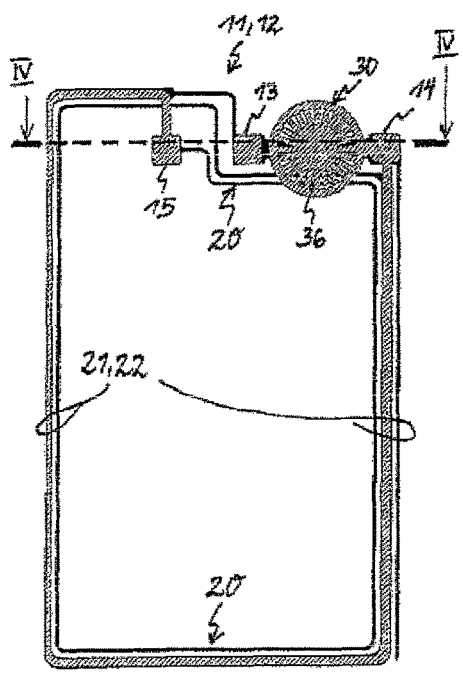
FIG. 3 shows a superimposition of the layers according to FIG. 1 and FIG. 2.

FIG. 3 shows a superimposed projection of the layers according to FIG. 1 and FIG. 2, as seen perpendicularly to the dielectric layer, which reveals the corresponding configuration of a part of the conductor track segments 21 and 22 of the conductor track 20 and also the, as seen perpendicularly to the dielectric layer, congruent arrangement of the front- and rear-side contact-making areas 13' to 15' and 13" to 15" of the plated-through holes 13 to 15. In this case the conductor track 20 forms a spiral antenna structure. It is evident in FIG. 3 that the thermode contact layer 30, as seen perpendicularly to the dielectric layer, completely covers the chip contact areas 23, 24. In FIG. 3 and in the following figures, the conductor track segments 21, 22 are illustrated with slightly different widths in order that the overlap of the two conductor track segments 21, 22 is made evident to a better extent pictorially. However, the width of the conductor track segments 21, 22 is not intended to be restricted to this embodiment, that is to say that the conductor track segments 21, 22 can have an identical width or a mutually different width and can overlap substantially completely or else only partly. In this context it should also be pointed out that the conductor track segments 21, 22 in FIG. 3 and in the following figures are also depicted as straight lines in order to simplify the illustration. However, the forms in their entirely are not intended to be restricted to this configuration. It is likewise possible for said conductor track segments to be configured as a zigzag course, as a continuously curved course, e.g. in the form of a sinusoidal curve, or as a form which is formed from combinations thereof, or else in some other way. Furthermore, the different segments of the conductor tracks—relative to the frontal and rear sides—can be arranged identically or else in a manner offset with respect to one another.

Figure 4:
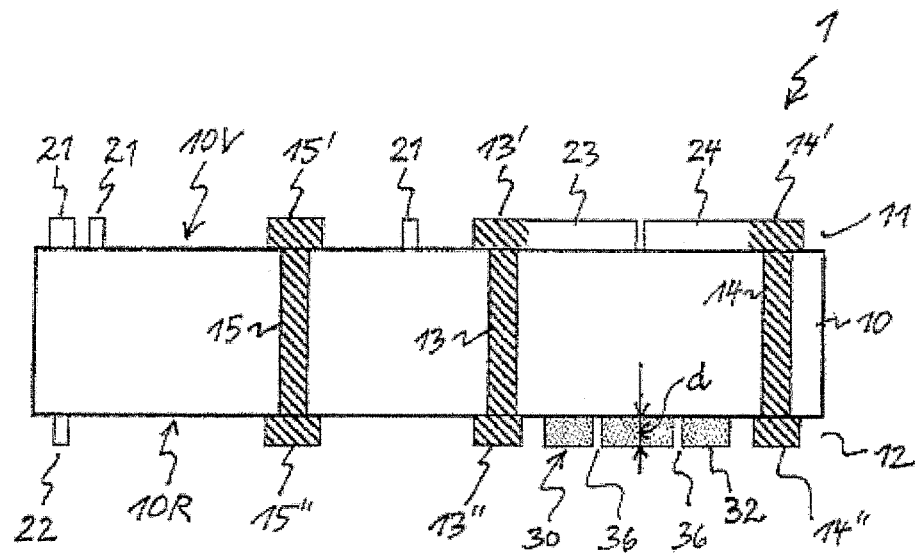
FIG. 4 shows a section IV-IV of the layers shown in FIG. 3.

FIG. 4 shows a schematic section—not true to scale—of a multilayered film element 1 comprising a dielectric layer 10, a first electrically conductive layer 11 according to FIG. 1 arranged on the front side 10V of the dielectric layer 10 and a second electrically conductive layer 12 according to FIG. 2 arranged on the rear side 10R of the dielectric layer 10. The section of the film element 1 runs along the sectional line IV-IV indicated in FIG. 3. As illustrated in FIG. 4, the first electrically conductive layer 11 and the second electrically conductive layer 12 are provided on the outer surface of the dielectric layer 10. The plated-through holes 13 to 15 penetrating through the dielectric layer 10 with the corresponding front- and rear-side contact-making areas 13' to 15' and 13" to 15" are illustrated in a hatched manner for better distinguishability in the section. The thermode contact layer 30 having a layer thickness d and having a thermode contact area 32 on the outer end side is arranged on the rear side 10R of the dielectric layer 10, said thermode contact layer having cutouts 36 running through the entire layer thickness d.

Figure 5:
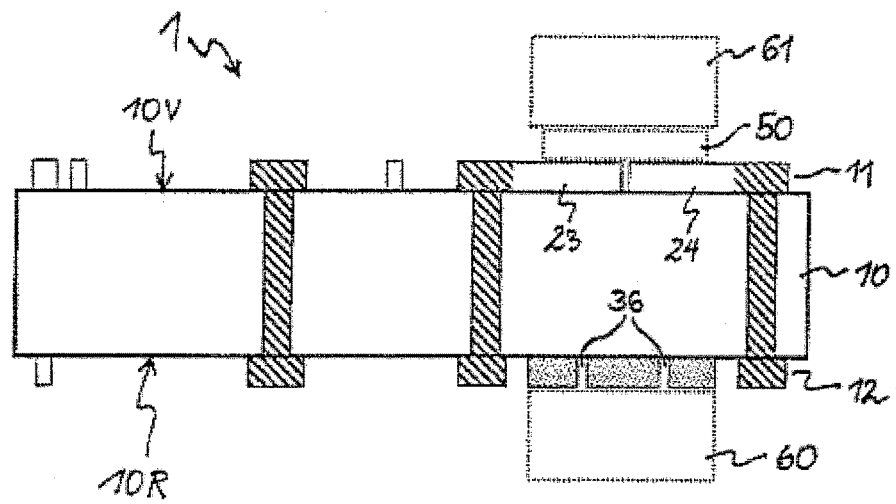
FIG. 5 shows the section IV-IV, as shown in FIG. 4, additionally with an illustration of a chip and two thermodes.

FIG. 5 shows a schematic section—not true to scale—of the multilayered film element 1, which section substantially corresponds to the sectional drawing illustrated in FIG. 4. FIG. 5 additionally illustrates a chip 50 and two opposite thermodes 60 and 61 in a position in which they are arranged in a method for fixing the chip 50 on the multilayered film element 1. In this case, the lower thermode 60 acts on the rear-side thermode contact layer 30, and the upper thermode 61, which can be embodied as a heated or unheated pressure plunger, forms a mechanical counter-bearing for the lower thermode 60 and acts on the chip 50. An intermediate strip (not illustrated) can be arranged between the chip 50 and the thermode 61 and is, for example, silicone-coated or provided with an adhesion-reducing coating in some other way, in order to prevent soiling or contamination of the thermode 61 with a connecting means and thus also adhesive bonding of the thermode 61 to the chip 50. In order to simplify the illustration, the figure does not designate all components with their reference signs; in this regard, reference is made to the corresponding reference signs indicated in FIG. 4. The end side 32 of the thermode contact layer 30 facing away from the dielectric layer 10 has, as the thermode contact area, the function of serving as a contact area for a (lower) thermode 60, as is indicated in FIG. 5.

Preferably, both the upper thermode 61 and the lower thermode 60 are heated, for instance to a temperature in the region of 200° C. The temperature of the upper thermode 61, that is to say of the thermode on the chip side of the film element 1, is usually higher than that of the lower thermode 60. As a result of the temperature spreading it is possible to obtain specific curing effects in the case of the connecting means. A connecting means applied between the chip 50 and the chip contact areas 23, 24 can be thermally activated by the heat which is emitted to the thermode contact layer 30 by the lower thermode 60 and is conducted through the dielectric layer 10 to the chip contact areas 23, 24. The thermal activation of the connecting means results in a permanent mechanical connection between the chip 50 and the chip contact areas 23, 24, and thus between the chip 50 and the multilayered film element 1. The end face of the chip 50 is smaller than the planar end side of the upper thermode 61 and optionally also smaller than the planar end side of the lower thermode 60, in order that the thermodes 60, 61 reliably cure, around the chip 50 as well, a connecting means that possibly emerges between the chip 50 and the chip contact areas 23, 24.

A thermally activatable, e.g. thermally curable, adhesive or a solder can be used as the connecting means. The connecting means can be applied, before the chip 50 is placed onto the chip contact areas 23, 24, to that side of the chip 50 which faces the chip contact areas 23, 24 and/or to that side of the chip contact areas 23, 24 which faces the chip 50. The thermally curable adhesive can be, for example, a thermosetting, electrically conductive, one-component epoxy adhesive comprising metalized, preferably spherical, non-flat particles or solid metal particles, e.g. metalized balls, flakes or platelets, which cures in a temperature range around approximately 190° C. in approximately 8 seconds. By way of example, metal particles composed of silver or copper which are embedded into the plastics matrix are advantageous in this context. Furthermore, however, it is also possible to use systems whose particles are formed from graphite and/or have other binder components which in turn form one- or multi-component systems. By way of example, lead, tin or palladium can be used as solder.

The dielectric layer 10 is a plastic film having a thickness of 4 to 250 μm which serves as a carrier Substrate for the first electrically conductive layer 11 and the second electrically conductive layer 12. Preferably, a film composed of PVC, PVC/ABS, PET, polycarbonate, polyolefins, polypropylene, polystyrene, polyethylene or of BOPP having a thickness of 36 to 150 μm (PET=polyethylene terephthalate; BOPP=biaxially oriented polypropylene) is used as the dielectric layer 10. Furthermore, it is also possible that the dielectric layer 10 additionally comprises one or more further layers and/or besides the dielectric layer 10 additionally one or more further layers are provided between the first electrically conductive layer 11 and the second electrically conductive layer 12, and/or consists of other non-conductive materials not mentioned above, e.g. a paper composite.

The electrically conductive layer or the first and second electrically conductive layers 11, 12 is/are preferably in each case a metallic layer having a thickness of 1 μm to 50 μm, preferably of 5 to 15 μm. The metal layer consists, for example, of iron, copper, aluminum, nickel, silver, gold, platinum, tin, zinc or an alloy of these metals and/or multilayer systems. Furthermore, it is also possible that the electrically conductive layers 11 and 12 are produced by means of at least one electrolytic reinforcement and can thus additionally comprise one or more conductive layers, for example consisting of a conductive printing material. In this context, combinations of different techniques for producing the metallic layers are also possible—for example electrolytic reinforcement in combination with targeted demetallization.

The plated-through holes 13, 14 and 15 preferably likewise consist of an electrically conductive, in particular metallic, material introduced into corresponding cutouts of the dielectric layer 10 and are preferably produced by means of at least one electrolytic process jointly with the electrically conductive layers 11 and 12. However, it is also possible to produce the plated-through holes by riveting methods, crimping methods, soldering methods and the like.

The conductor track segment 21 has—as indicated in FIG. 1—the form of a flat coil having N turns, having a distance between the turns of 0.05 to 5 mm and a conductor track width of 0.05 to 5 mm. The number N of turns is preferably in the range of 2 to 10. The outermost turn preferably encloses a rectangular area having a width of 40 mm to 100 mm and a length of 20 mm to 80 mm. The conductor track segment 22 preferably has a length of more than ¼ of the innermost turn of the conductor track segment 21 and is shaped—as indicated in FIG. 2—preferably in the form of half to one turn.

It is furthermore also possible for the film element 1 to have, besides the layers explained with reference to FIG. 1 to FIG. 4, one or more further layers and to form, for example, a laminating film, a transfer film or a region of a transfer ply of a transfer film. Furthermore, it is also possible for the film element 1 not to be present in separated form, but rather to be part of a film web preferably having a multiplicity of film elements 1 of identical type which are arranged alongside one another.

The thermode contact layer 30 can be produced in the same method as the electrically conductive layers 11, 12. In this case, the electrically conductive thermode contact layer 30 can be embodied as a metallization, for example composed of aluminum, iron, copper, nickel, platinum, silver, gold, tin, zinc or an alloy of these materials. Moreover, the thermode contact layer 30 in this case can additionally fulfill a function as an electromagnetic component. Furthermore, it is also possible that the thermode contact layer 30 is applied to the dielectric substrate 10 only after the formation of the electrically conductive layers 11, 12, e.g. is applied, e.g. adhesively bonded or fixed by means of connecting elements, temporarily or permanently as a finished component.

In the sections illustrated in FIG. 4 and FIG. 5, it is evident that the cutouts 36 run through the thermode contact layer 30 from the thermode contact area 32 as far as the opposite end face of the thermode contact layer 30. It is possible for an observer of the thermode contact layer 30 to discern the dielectric substrate 10 through the cutouts 36 in a viewing direction perpendicular to the dielectric layer 10. By means of coloring of the thermode contact layer 30 or of the thermode contact area 32 and of the dielectric layer 10 and/or shaping of the cutouts 36, an optical information item, e.g. a pattern, a graphic, a character such as a symbol, a letter, a number, can thus be provided for an observer or recognition system.

It is also possible that, as a result of the emission of heat from the thermode 60 to the thermode contact layer 30 and the adjoining dielectric layer 10, material of the dielectric layer melts and runs at least partly into the cutouts 36 in the liquid state. An improved connection of the thermode contact layer 30 and of the dielectric layer 10 can result in this way. It is likewise possible that a layer applied to the multilayered film element 1 in a subsequent coating method, e.g. a surface protective layer composed of a clearcoat or a laminating film, at least partly extends into the cutouts 36 and/or is connected to the dielectric layer 10 via one or more cutouts 36. An interlayer adhesion can thereby be obtained.

Figure 6:
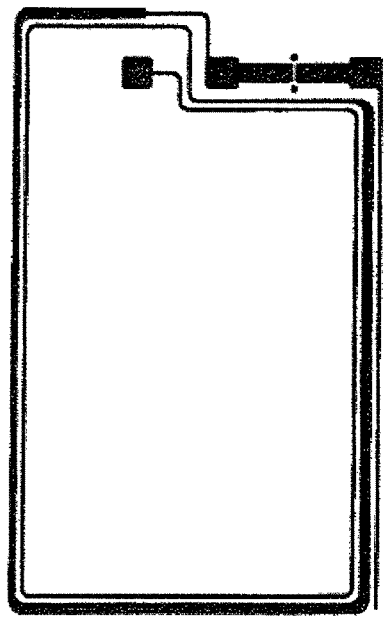
FIGS. 6, 9, 12, 15 and 18 in each case show the first electrically conductive layer in accordance with FIG. 1.

FIG. 6, for the purpose of better illustrating the exemplary embodiment on the sheet of the drawings, once again shows the first electrically conductive layer according to FIG. 1 arranged on a front side of a dielectric layer.

Figure 7:
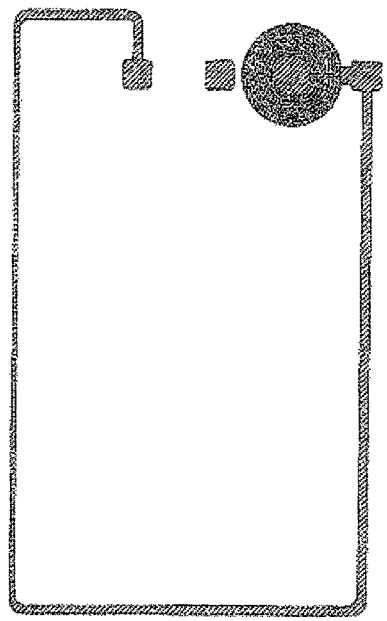
FIGS. 7, 10, 13, 16 and 19 in each case show the second electrically conductive layer in accordance with FIG. 2 together with a respective different further exemplary embodiment of the thermode contact layer.

FIG. 7 shows the second electrically conductive layer according to FIG. 2 together with a further exemplary embodiment of the thermode contact layer. As illustrated in an enlarged manner in FIG. 7A, the thermode contact layer 30 is embodied as a circular disk having a thickness d and an external diameter Da, which has, in a ring-shaped region having an internal diameter Di and an external diameter Da, cutouts 36 in the form of 90° arcs having a width b which run in each case at a constant distance from the center axis of the disk-shaped thermode contact layer 30. At the angular positions at 0°, 90°, 180° and 270°, continuous webs run from the internal diameter Di to the external diameter Da, the arcuate cutouts 36 in each case ending at said webs. By means of the cutouts 36 and the webs, the thermode contact layer 30 forms, in the ring-shaped region, concentrically extending annuli having the width b. Typical and particularly advantageous (identified by "preferably" in the table) values of the layer thickness d, of the external diameter Da, of the internal diameter Di and of the width b for the present exemplary embodiment of the thermode contact layer 30 are indicated in column 3 of the table.

Figure 8:
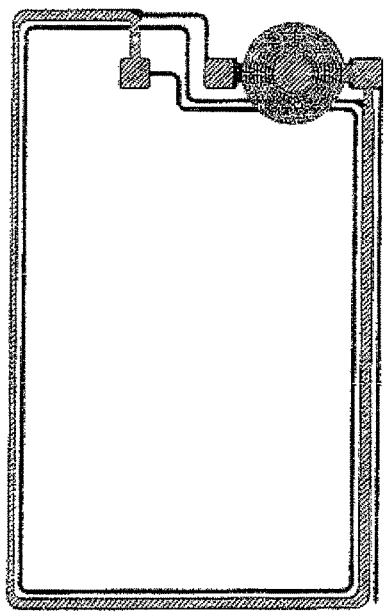
FIGS. 8, 11, 14, 17 and 20 in each case show a superimposition of the first electrically conductive layer according to FIG. 1 (corresponding to FIGS. 6, 9, 12, 15 and 18) with the second electrically conductive layer and the thermode contact layer according to FIGS. 7, 10, 13, 16 and 19.

FIG. 8 shows a superimposed projection of the layers according to FIG. 6 and FIG. 7, as seen perpendicularly to the dielectric layer. The illustration corresponds to the illustration in FIG. 3, to the explanation of which reference is made.

Figure 9:
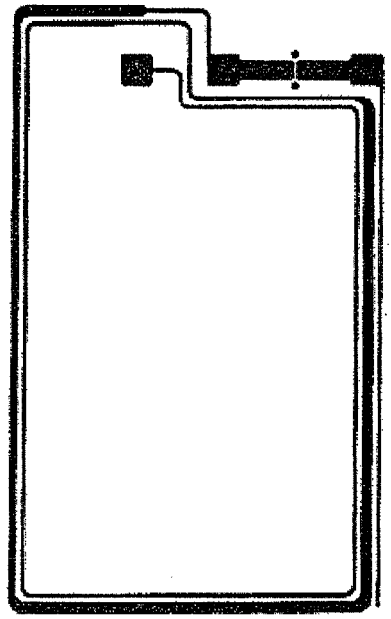

FIG. 9, for the purpose of better illustrating the exemplary embodiment on the sheet of the drawings, once again shows the first electrically conductive layer according to FIG. 1 arranged on a front side of a dielectric layer.

Figure 10:
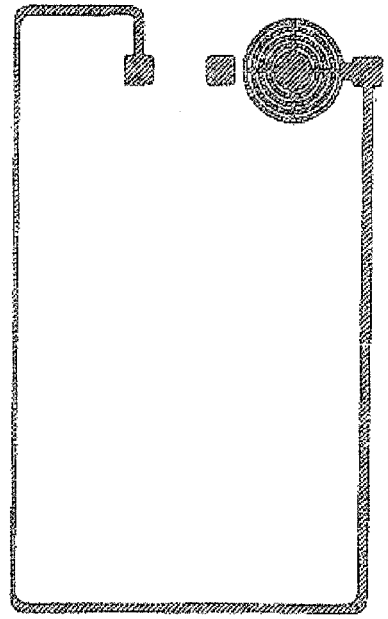
Figure 10A:
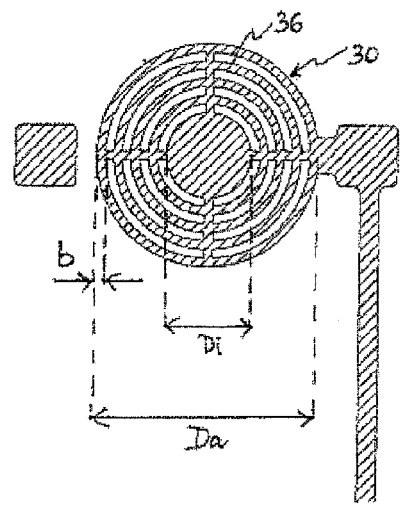

FIG. 10 shows the second electrically conductive layer according to FIG. 2 together with a further exemplary embodiment of the thermode contact layer 30. FIG. 10A shows an enlarged excerpt from FIG. 10 with an illustration of the thermode contact layer 30. The exemplary embodiment of the thermode contact layer 30 largely corresponds to the exemplary embodiment in FIG. 7 and FIG. 7A, to which reference is made, only with dimensions deviating therefrom. Typical and particularly advantageous (identified by "preferably" in the table) values of the layer thickness d, of the external diameter Da, of the internal diameter Di and of the width b for the present exemplary embodiment of the thermode contact layer 30 are indicated in column 4 of the table.

Figure 11:
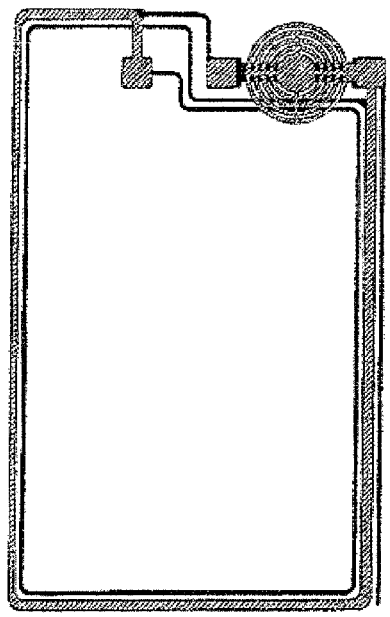

FIG. 11 shows a superimposed projection of the layers according to FIG. 9 and FIG. 10, as seen perpendicularly to the dielectric layer. The illustration corresponds to the illustration in FIG. 3, to the explanation of which reference is made.

Figure 12:
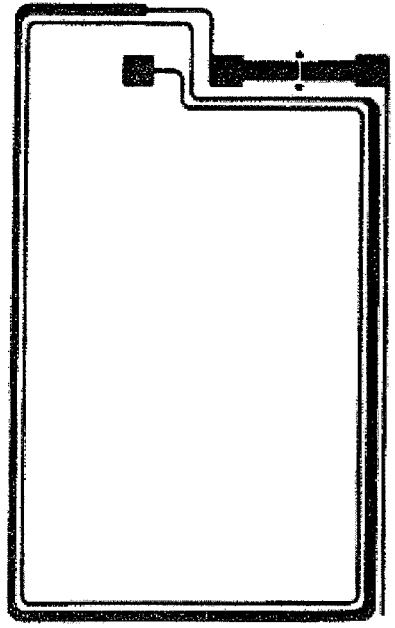

FIG. 12, for the purpose of better illustrating the exemplary embodiment on the sheet of the drawings, once again shows the first electrically conductive layer according to FIG. 1 arranged on a front side of a dielectric layer.

Figure 13:
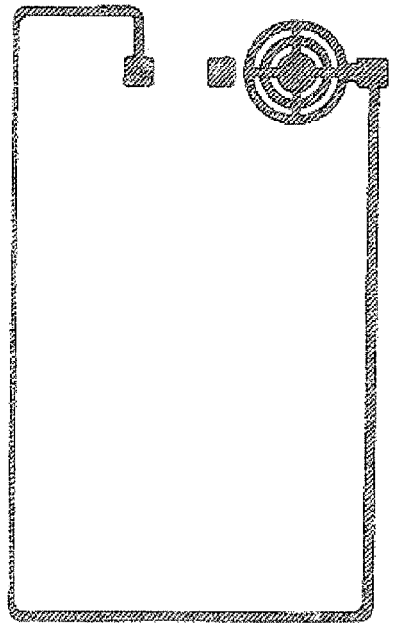
Figure 13A:
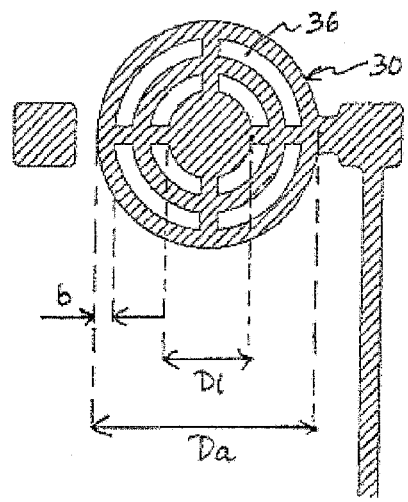

FIG. 13 shows the second electrically conductive layer according to FIG. 2 together with a further exemplary embodiment of the thermode contact layer 30. FIG. 13A shows an enlarged excerpt from FIG. 13 with an illustration of the thermode contact layer 30. The exemplary embodiment of the thermode contact layer 30 largely corresponds to the exemplary embodiment in FIG. 7 and FIG. 7A, to which reference is made, only with dimensions deviating therefrom. Typical and particularly advantageous (identified by "preferably" in the table) values of the layer thickness d, of the external diameter Da, of the internal diameter Di and of the width b for the present exemplary embodiment of the thermode contact layer 30 are indicated in column 5 of the table.

Figure 14:
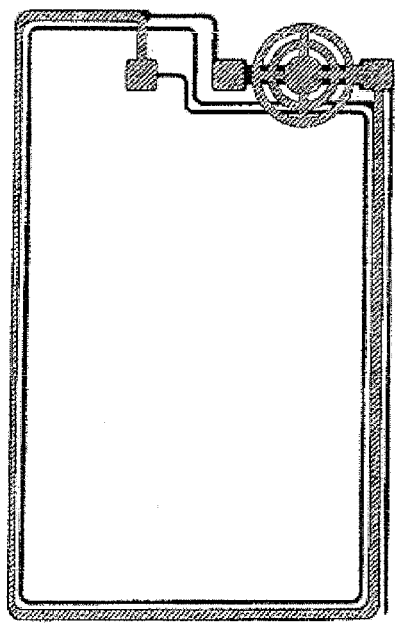

FIG. 14 shows a superimposed projection of the layers according to FIG. 12 and FIG. 13, as seen perpendicularly to the dielectric layer. The illustration corresponds to the illustration in FIG. 3, to the explanation of which reference is made.

Figure 15:
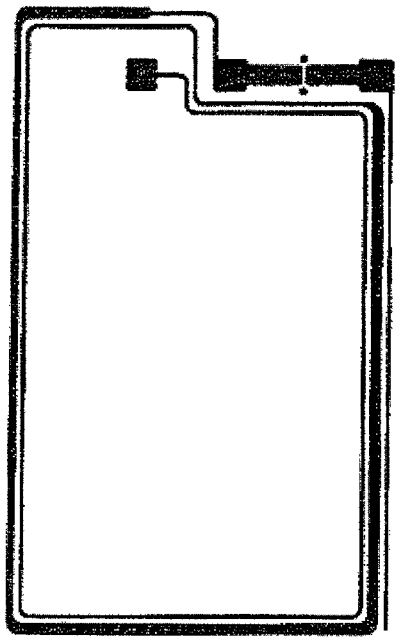

FIG. 15, for the purpose of better illustrating the exemplary embodiment on the sheet of the drawings, once again shows the first electrically conductive layer according to FIG. 1 arranged on a front side of a dielectric layer.

Figure 16:
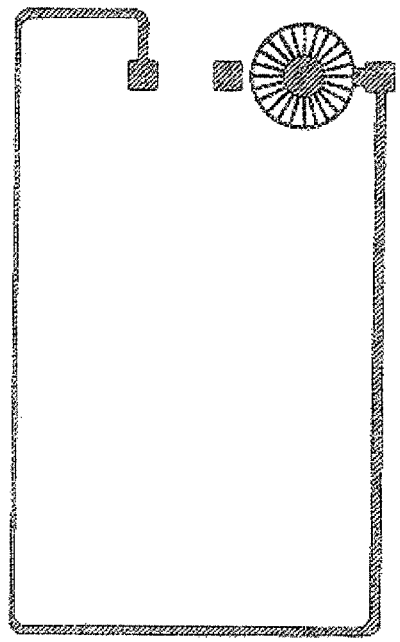

FIG. 16 shows the second electrically conductive layer according to FIG. 2 together with a further exemplary embodiment of the thermode contact layer 30. As illustrated in an enlarged manner in FIG. 16A, the thermode contact layer 30 is embodied as a circular disk having a thickness d and an external diameter Da, which has, in a hollow-cylindrical region having an internal diameter Di and an external diameter Da−2b, twenty-four wedge-shaped cutouts 36 arranged radially, the tapering ends of the wedges being oriented toward the disk axis and running parallel to the disk axis. Typical and particularly advantageous (identified by "preferably" in the table) values of the layer thickness d, of the external diameter Da, of the internal diameter Di and of the width b for the present exemplary embodiment of the thermode contact layer 30 are indicated in column 6 of the table.

Figure 17:
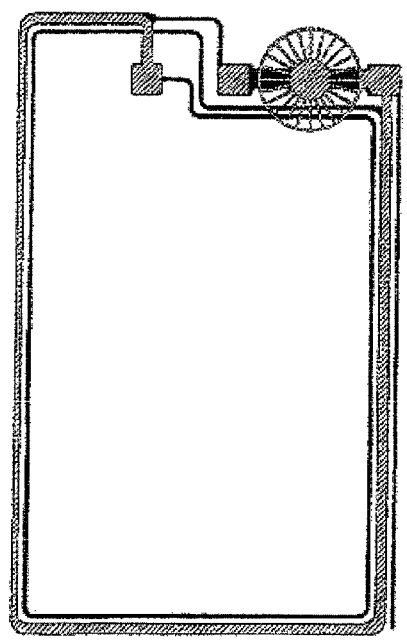

FIG. 17 shows a superimposed projection of the layers according to FIG. 15 and FIG. 16, as seen perpendicularly to the dielectric layer. The illustration corresponds to the illustration in FIG. 3, to the explanation of which reference is made.

Figure 18:
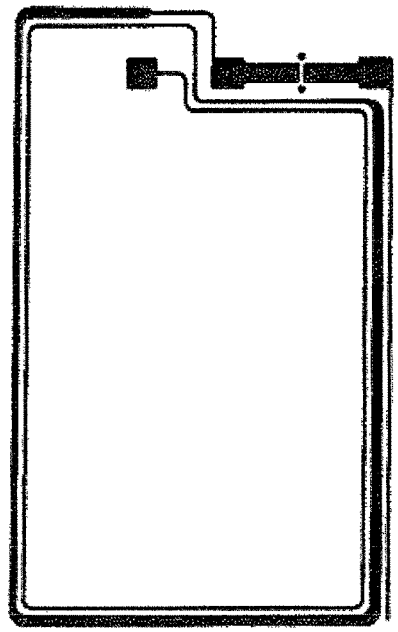

FIG. 18, for the purpose of better illustrating the exemplary embodiment on the sheet of the drawings, once again shows the first electrically conductive layer according to FIG. 1 arranged on a front side of a dielectric layer.

TABLE

Figure 7A:
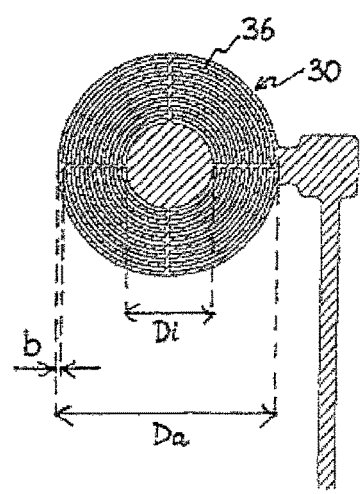
FIGS. 7A, 10A, 13A, 16A and 19A in each case show an enlarged view of the rear-side thermode contact layer according to FIGS. 7, 10, 13, 16 and 19.
Figure 16A:
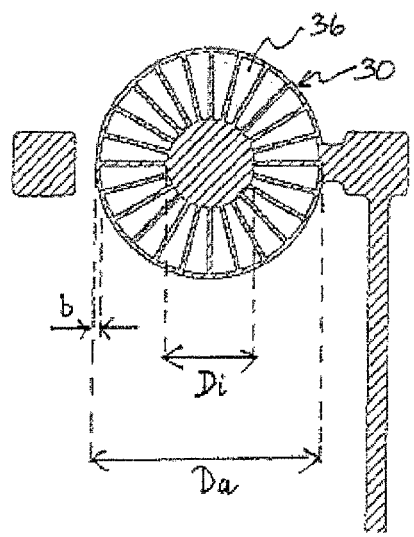
Figure 19:
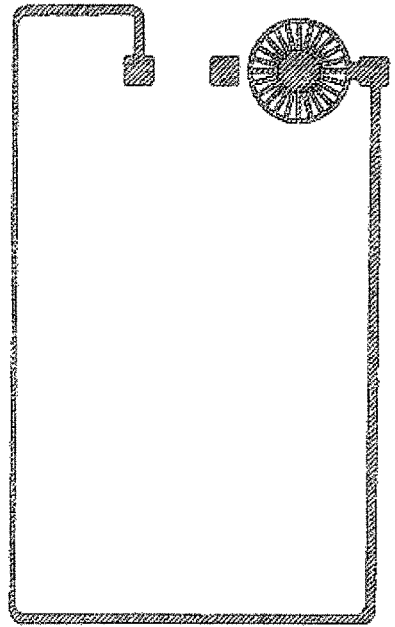
Figure 19A:
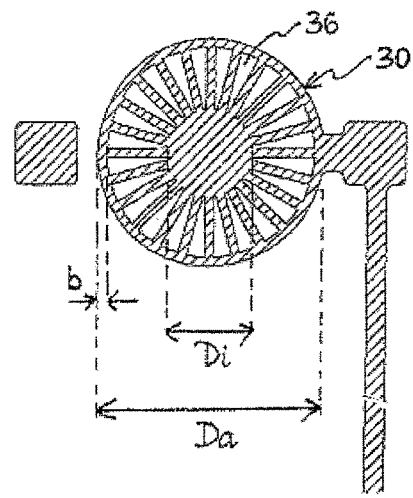

| 1 | 2 | 3 | 4 | 5 | 6 | 7 |
|---|---|---|---|---|---|---|
| | FIG. 2A | FIG. 7A | FIG. 10A | FIG. 13A | FIG. 16A | FIG. 19A |
| d [µm] | 2-50 | 2-50 | 2-50 | 2-50 | 2-50 | 2-50 |
| d [µm], preferably | 10 | 10 | 10 | 10 | 10 | 10 |
| Da [mm] | 7-20 | 7-20 | 7-20 | 7-20 | 7-20 | 7-20 |
| Da [mm] preferably | 13 | 13 | 13 | 13 | 13 | 13 |
| Di [mm] | 2-10 | 2-10 | 2-10 | 2-10 | 2-10 | 2-10 |
| Di [mm] preferably | 5 | 5 | 5 | 5 | 5 | 5 |
| b [mm] | 0.2-2 | 0.1-2 | 0.2-2 | 0.2-2 | 0.1-2 | 0.2-2 |
| b [mm] preferably | 1 | 0.25 | 0.5 | 1 | 0.25 | 0.5 |

FIG. 19 shows the second electrically conductive layer according to FIG. 2 together with a further exemplary embodiment of the thermode contact layer 30. FIG. 19A shows an enlarged excerpt from FIG. 19 with an illustration of the thermode contact layer 30. The exemplary embodiment of the thermode contact layer 30 largely corresponds to the exemplary embodiment in FIG. 2 and FIG. 2A, to which reference is made, only with dimensions deviating therefrom. Typical and particularly advantageous (identified by "preferably" in the table) values of the layer thickness d, of the external diameter Da, of the internal diameter Di and of the width b for the present exemplary embodiment of the thermode contact layer 30 are indicated in column 7 of the table.

Figure 20:
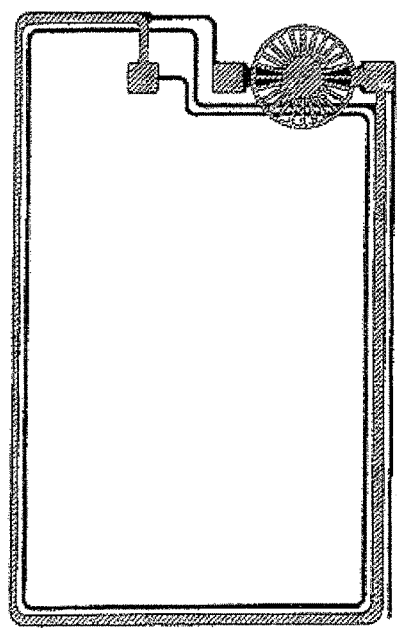

FIG. 20 shows a superimposed projection of the layers according to FIG. 18 and FIG. 19, as seen perpendicularly to the dielectric layer. The illustration corresponds to the illustration in FIG. 3, to the explanation of which reference is made.

Besides the illustrated and described structuring of the thermode contact layer, further shapings such as e.g. linear or circular grid structures or non-interconnected structures are conceivable, which can arrive at equivalent results on account of a similar degree of area occupancy.

Figure 21:
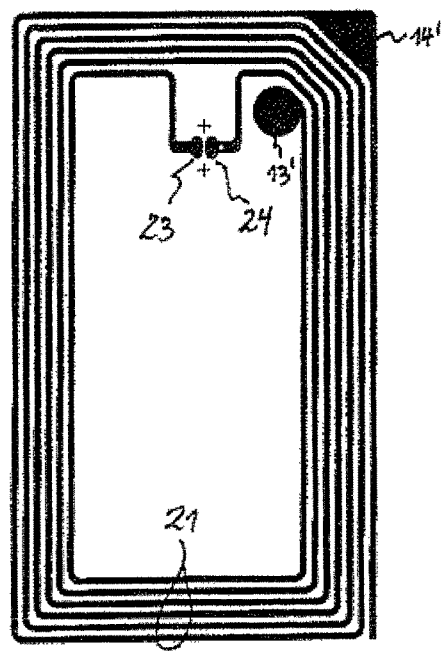
FIG. 21 shows a further embodiment of a first electrically conductive layer with an inner chip bond region, said first electrically conductive layer being arranged on a front side of the dielectric layer.
Figure 22:
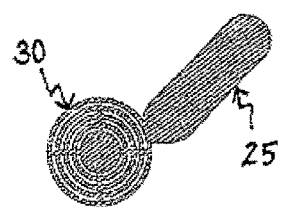
FIG. 22 shows a second electrically conductive layer in the form of a contact-making region and a thermode contact layer, which are arranged together on a rear side of a dielectric layer.
Figure 23:
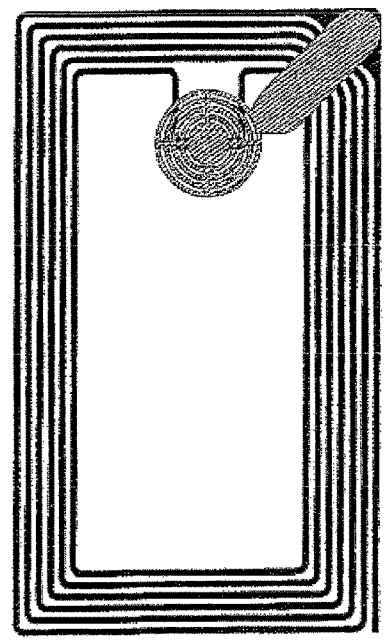
FIG. 23 shows a superimposition of the layers according to FIG. 21 and FIG. 22.

FIGS. 21 to 23 show a further advantageous embodiment of a film element according to the invention. In this case, FIG. 21 shows a front side of a dielectric layer with a conductor track 21, with front-side contact-making areas 13', 14' of a first and a second plated-through hole 13, 14, and with chip contact areas 23, 24 for making contact with a chip (not illustrated here), said chip contact areas lying within the conductor track 21. FIG. 22 shows a rear side—corresponding to FIG. 21—of a dielectric layer with a thermode contact layer 30 and a connecting region 25. In this case, in this exemplary embodiment the rear side does not comprise a further conductor track, but rather substantially only the thermode contact layer 30 and the connecting region 25 between the plated-through holes 13, 14. In this context, this is referred to as a single-ended antenna. FIG. 23 shows a superimposed projection of the layers according to FIG. 21 and FIG. 22, as seen perpendicularly to the dielectric layer.

Figure 24:
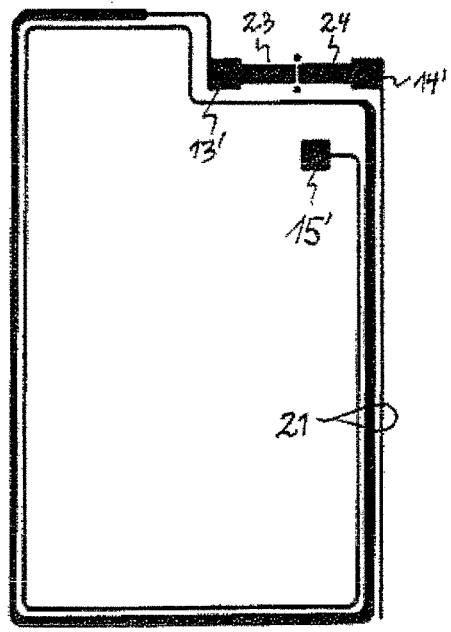
FIG. 24 shows a further embodiment of a first electrically conductive layer arranged on a front side of a dielectric layer.
Figure 25:
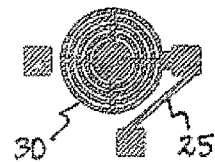
FIG. 25 shows a second electrically conductive layer in the form of a contact-making region and a thermode contact layer, which are arranged together on a rear side of a dielectric layer.
Figure 26:
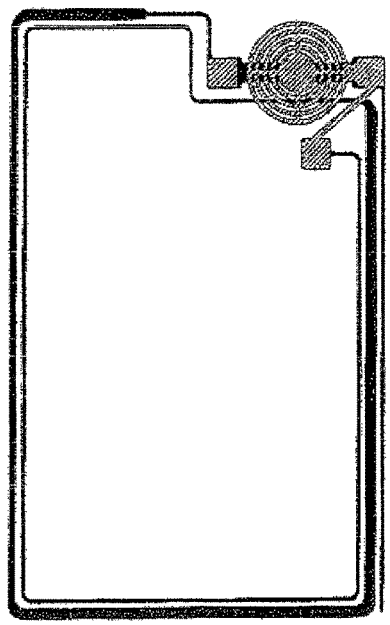
FIG. 26 shows a superimposition of the layers according to FIG. 24 and FIG. 25.

FIGS. 24 to 26 show a further advantageous embodiment of a film element according to the invention. In this case, FIG. 24 shows—similarly to FIG. 21—a front side of a dielectric layer with a conductor track 21, with front-side contact-making areas 13' to 15' of plated-through holes 13 to 15 and with chip contact areas 23 and 24 for making contact with a chip (not illustrated here). In this case, the third plated-through hole 15 is not arranged on a line with the first 13 and the second plated-through hole 14, but rather was positioned below them.

FIG. 25 shows a rear side—corresponding to FIG. 22—of a dielectric layer with a thermode contact layer 30 and a connecting region 25. In this case, in this exemplary embodiment the rear side does not comprise a further conductor track, but rather substantially only the thermode contact layer 30 and the connecting region 25 between the plated-through holes 14, 15. In this context, this is again referred to as a single-ended antenna. FIG. 26 shows a superimposed projection of the layers according to FIG. 24 and FIG. 25, as seen perpendicularly to the dielectric layer.

Figure 27:
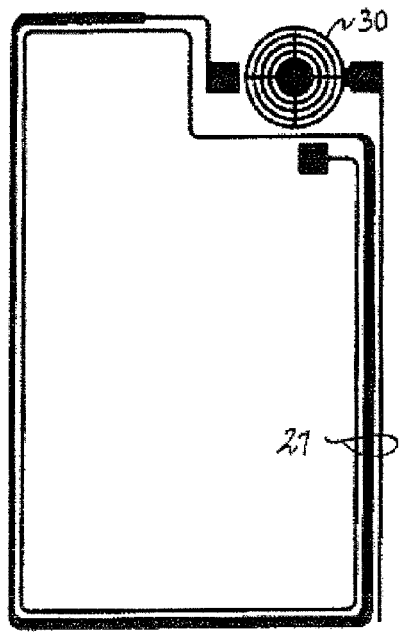
FIG. 27 shows a further embodiment of a second electrically conductive layer with an implemented thermode contact area, said second electrically conductive layer being arranged on a rear side of a dielectric layer.
Figure 28:
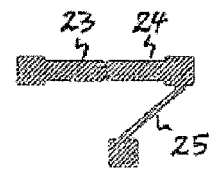
FIG. 28 shows a first electrically conductive layer in the form of a bonding pad and contact-making region, which are arranged together on a front side of a dielectric layer.
Figure 29:
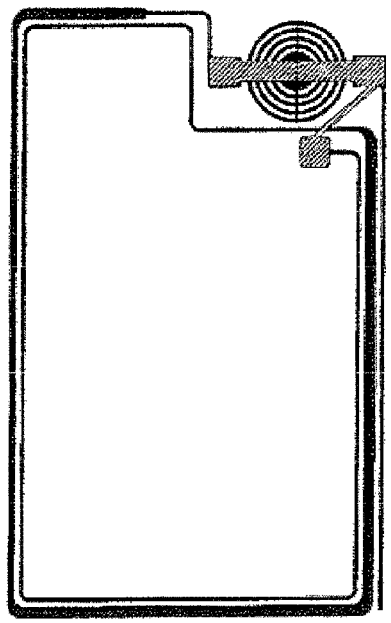
FIG. 29 shows a superimposition of the layers according to FIG. 27 and FIG. 28.

FIGS. 27 to 29 show a further advantageous embodiment of a film element according to the invention. In this case, FIG. 27 shows a rear side of a dielectric layer with a conductor track 21 and with a thermode contact layer 30. In this case, the thermode contact layer 30 can be electrically connected (as illustrated) to the conductor track 21 or can be arranged separately therefrom, that is to say in a manner electrically insulated therefrom. FIG. 28 shows a front side of a dielectric layer with chip contact areas 23 and 24 for making contact with a chip (not illustrated here). In this exemplary embodiment, the front side does not have a further conductor track and is substantially constructed from the chip contact-making regions 23, 24 and the connecting region 25 between the plated-through holes. FIG. 29 shows a superimposed projection of the layers according to FIG. 27 and FIG. 28, as seen perpendicularly to the dielectric layer.

Figure 30:
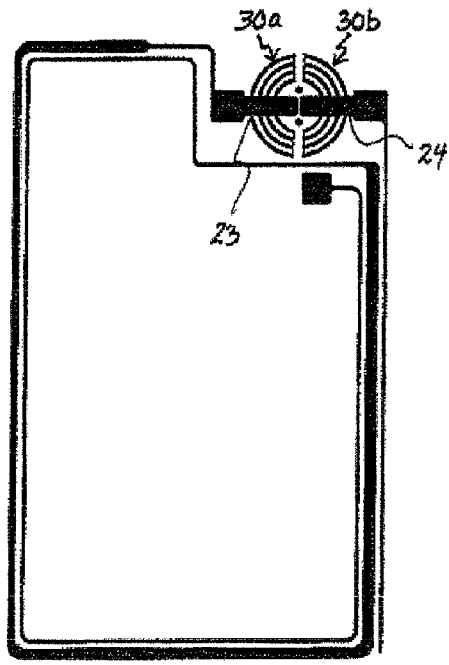
FIG. 30 shows a further embodiment of a first electrically conductive layer—arranged on a front side of a dielectric layer—with an implemented frontal thermode contact area, which consists of thermode contact area regions, and a chip bond region.
Figure 31:
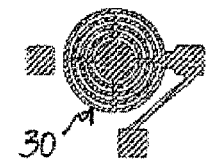
FIG. 31 shows the second electrically conductive layer in accordance with FIG. 25.
Figure 32:
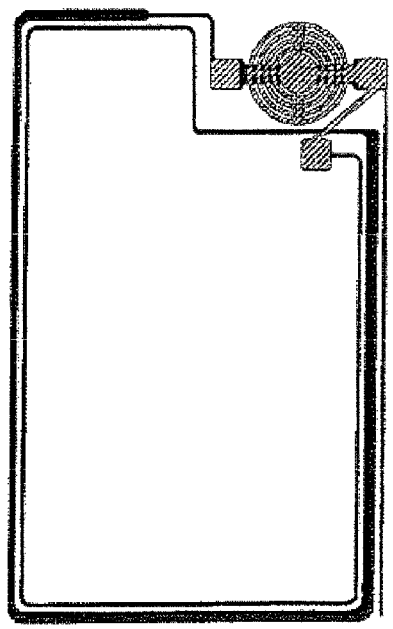
FIG. 32 shows a superimposition of the layers according to FIG. 30 and FIG. 31.

FIGS. 30 to 32 show a further particularly advantageous embodiment of a film element according to the invention. In this case, FIG. 30 shows a front side of a dielectric layer—similarly to FIG. 24—with the difference that additional frontal thermode contact layers in the form of two partial regions 30a, 30b were applied around a chip contact areas 23 and 24, for making contact frontally with a chip (not illustrated here). In combination with the rear-side thermode contact layer 30, a very homogeneous temperature distribution can be obtained with this exemplary embodiment. FIG. 32 shows in this exemplary embodiment a superimposed projection of the layers according to FIG. 30 and FIG. 31 as seen perpendicularly to the dielectric layer.

It is possible that firstly a side of a chip and/or of the chip contact areas 23, 24 which has electrical contacts is coated with a thermally activatable connecting means, then the side of the chip which has the electrical contacts is arranged on the chip contact areas 23, 24, and subsequently a frontal thermode applies heat to or directly contacts the partial regions 30a, 30b of the frontal thermode contact layer and a rear-side thermode acts on, preferably contacts, the rear-side thermode contact layer 30. The thermally activatable connecting means is activated in this way. After the connecting means has been activated, the thermodes are separated, preferably lifted off, from the frontal and rear-side thermode contact areas 30a, 30b, 30.

In this context it should be mentioned, on the one hand, that in the case of a divided thermode contact layer—corresponding to the embodiments according to FIG. 30—a rear-side thermode contact layer 30 can be dispensed with since the heat transfer from the partial regions 30a, 30b of the front-side divided thermode contact layer to the chip contact areas 23, 24 already suffices for activating the connecting means. Embodiments comprising a sole divided frontal or else rear-side thermode contact layer are therefore possible. On the other hand, it should be mentioned that the division of the thermode contact layer is not just restricted to the embodiment according to FIG. 30, but rather can have as many partial regions as desired. However, a division into two in the manner illustrated with a direct connection to the chip contact areas 23 and 24 is advantageous in this case.

LIST OF REFERENCE SIGNS

1 Multilayered film element
10 Dielectric layer
10R Rear side of 10
10V Front side of 10
11 First layer forming a first component, first electrically conductive layer
12. Second layer forming a first component, second electrically conductive layer
13 First plated-through hole
13', 13" Front- and rear-side contact-making areas of 13
14 Second plated-through hole
14', 14" Front- and rear-side contact-making areas of 14
15 Third plated-through hole
15', 15" Front- and rear-side contact-making areas of 15
20 Conductor track
21 First conductor track segment 22 Second conductor track segment
23 First component contact area, first chip contact area
24 Second component contact area, second chip contact area
25 Connecting region
30 Thermode contact layer
30a, 30b Partial region of the thermode contact layer
32 Thermode contact area
36 Cutout of 30
50 Second component, chip
60 Thermode (bottom)
61 Thermode (top, chip side)
b Line width of 30
d Layer thickness of 30
Da External diameter of 30
Di Internal diameter of 30

The invention claimed is:

1. A multilayered film element comprising a dielectric layer having a front side and a rear side situated opposite the front side, wherein the film element further has a first electrically conductive layer forming a first component on the front side of the dielectric layer, and wherein the first electrically conductive layer has a surface facing away from the dielectric layer forming at least one component contact area arranged on the front side and connected to the first component and serving for arranging a second component, wherein the film element has at least one thermode contact layer comprising an inner end side which faces the dielectric layer and an outer surface facing away from the dielectric layer, the thermode contact layer being connected to the dielectric layer via the inner end side and which, as seen perpendicularly to the dielectric layer, is arranged in the region of the at least one component contact area and has a thermode contact area on the outer surface of the at least one thermode contact layer facing away from the dielectric layer, said thermode contact area forming an outer surface of the film element, and
   wherein the layer forming the first component is a metal layer having a thickness of 1 μm to 50 μm, and wherein that the thermode contact layer is likewise embodied as a metal layer, and
   wherein the at least one thermode contact layer is embodied as a rear-side thermode contact layer which is arranged on the rear side of the dielectric layer, and which overlaps and/or encloses the at least one component contact area, as seen perpendicularly to the dielectric layer, at least in regions, and
   wherein the thermode contact layer is adapted to conduct heat, applied by a thermode in contact with the thermode contact surface, through the dielectric layer to the component contact area, for mounting the second component on the surface of the component contact area, and
   wherein the thermode contact layer further forms a part of a third electrical component of the film element, the part of the third electrical component of the film element formed by the thermode contact layer being at least one of a capacitor area, a resistor area and a coil or coil element having a predefined inductance.

2. The multilayered film element as claimed in claim 1, wherein the layer forming the first component is a metal layer having a layer thickness of 5 μm to 15 μm.

3. The multilayered film element as claimed in claim 1, wherein the first component is an antenna structure.

4. The multilayered film element as claimed in claim 1, wherein the at least one component contact area is electrically connected to the first component.

5. The multilayered film element as claimed in claim 1, wherein the at least one component contact area is a chip contact area for arranging an electronic microchip.

6. The multilayered film element as claimed in claim 1, further comprising a front-side thermode contact layer which is arranged on the front side of the dielectric layer and which overlaps or encloses the at least one component contact area at least in regions, as seen perpendicularly to the dielectric layer.

7. The multilayered film element as claimed in claim 1, wherein the rear-side thermode contact layer completely covers the at least one component contact area, as seen perpendicularly to the dielectric layer.

8. The multilayered film element as claimed in claim 6, wherein the front-side thermode contact layer and the rear-side thermode contact layer are thermally coupled to one another by a heat-conducting component.

9. The multilayered film element as claimed in claim 1, wherein the at least one thermode contact layer is formed from a material having a thermal conductivity of greater than 50 W/(m K).

10. The multilayered film element as claimed in claim 1, wherein the layer forming the first component is a metal layer composed of iron, copper, aluminum, nickel, silver, gold, platinum, tin, zinc or an alloy of these metals and/or a multilayer system.

11. The multilayered film element as claimed in claim 1, wherein the at least one thermode contact area has a circular or rectangular contour.

12. The multilayered film element as claimed in claim 1, wherein the at least one thermode contact area, as measured in the plane of the dielectric layer, has a maximum extent in the range of 5 to 25 mm.

13. The multilayered film element as claimed in claim 1, wherein the at least one thermode contact layer has a maximum layer thickness in the range of 6 to 14 μm.

14. The multilayered film element as claimed in claim 1, wherein the at least one thermode contact layer, as seen perpendicularly to the dielectric layer, comprises two or more partial regions.

15. The multilayered film element as claimed in claim 1, wherein the layer forming the first component has a first layer arranged on the front side, a second layer arranged on the rear side, and one or more plated-through holes which penetrate through the dielectric layer and by means of which the first layer and the second layer are electrically conductively connected to one another, wherein the at least one thermode contact layer and the one or more plated-through holes, as seen perpendicularly to the dielectric layer, are arranged without mutual overlap, and preferably have a distance of at least 200 μm.

16. The multilayered film element as claimed in claim 1, wherein the thermode contact area, as seen perpendicularly to the dielectric layer, has one or more cutouts penetrating completely through the at least one thermode contact layer, wherein the cutouts and/or the thermode contact area surrounding the cutouts provide an optical information item.

17. The multilayered film element as claimed in claim 1, wherein the thermode contact area has a surface relief, which brings about an optical effect.

18. The multilayered film element as claimed in claim 1, wherein the at least one thermode contact layer is electrically conductively connected to the layer forming the first component and/or to the at least one component contact area, or is electrically insulated from the layer forming the first component and/or from the at least one component contact area.

19. A method for fixing an electronic chip on a multilayered film element, wherein the method comprises the following steps:
provided a dielectric layer having a front side and a rear side disposed opposite the front side;
applying a first electrically conductive layer on the front side of the dielectric layer, the first electrically conductive layer comprising a metal and having a thickness of 1 µm to 50 µm, and further including at least one chip contact area having a surface for mounting an electronic chip;
applying at least one thermode contact layer on the rear side of the dielectric layer, the at least one thermode contact layer comprising a metal and including a thermode contact surface on a side of the at least one thermode contact layer facing away from the dielectric layer, the thermode contact layer being arranged in the region of the at least one chip contact area as seen perpendicularly to the dielectric layer, said thermode contact surface forming an outer surface of the film element;
applying a thermally activatable adhesive on the surface of the at least one chip contact area of the first electrically conductive layer;
arranging a side of an electronic chip having contact areas on the adhesive applied on the at least one chip contact area of the first electrically conductive layer;
contacting the surface of the at least one thermode contact layer with a thermode for activating the adhesive, the thermode contact layer being adapted to conduct heat applied by the thermode through the dielectric layer to the chip contact area; and
separating the thermode from the at least one thermode contact area after the adhesive has been activated.

20. The multilayered film element as claimed in claim 1, wherein the at least one thermode contact layer is formed from a material that is anisotropic with regard to thermal conductivity.

21. The multilayered film element as claimed in claim 1, wherein the at least one thermode contact layer comprises nanoparticles and/or nanotubes and/or mixtures thereof.

22. The method as claimed in claim 19, wherein the at least one thermode contact layer further forms a part of an electrical component of the film element, the part of the electrical component of the film element formed by the thermode contact layer being at least one of a capacitor area, a resistor area and a coil or coil element having a predefined inductance.

23. The method as claimed in claim 19, wherein the contact areas of the electronic chip are embodied as electrical contacts.

24. The method as claimed in claim 19, wherein the method furthermore comprises the following step:
severing an electrically conductive connection between the at least one thermode contact layer and the first electrically conductive layer, and/or the at least one chip contact area.

25. The method as claimed in claim 19, further comprising coating the contact areas of the electronic chip with a thermally activatable conductive, adhesive.

26. A multilayered film element comprising:
a dielectric layer having a front side and a rear side disposed opposite the front side;
a first electrically conductive layer disposed on the front side of the dielectric layer, the first electrically conductive layer comprising a metal and having a thickness of 1 µm to 50 µm, and further including at least one chip contact area having a surface for mounting an electronic chip; and
at least one thermode contact layer disposed on the rear side of the dielectric layer, the at least one thermode contact layer comprising a metal and including a thermode contact surface on a side of the at least one thermode contact layer facing away from the dielectric layer, the thermode contact layer being arranged in the region of the at least one chip contact area as seen perpendicularly to the dielectric layer, said thermode contact surface forming an outer surface of the film element,
wherein the thermode contact layer is adapted to conduct heat, applied by a thermode in contact with the thermode contact surface, through the dielectric layer to the chip contact area, for mounting an electronic chip on the surface of the chip contact area, and
wherein the thermode contact layer further forms a part of an electrical component of the film element, the part of the electrical component of the film element formed by the thermode contact layer being at least one of a capacitor area, a resistor area and a coil or coil element having a predefined inductance.

* * * * *